(12) United States Patent
Chou et al.

(10) Patent No.: US 7,915,722 B2
(45) Date of Patent: Mar. 29, 2011

(54) INFORMATION SENSING DEVICE WITH ELECTROCONDUCTIVE STRUCTURE AND MOLDED BODY SURROUNDING EACH OTHER

(75) Inventors: Bruce C. S. Chou, Hsin Chu (TW); Chen-Chih Fan, Chu Pei (TW)

(73) Assignee: Egis Technology Inc., Taipei (TW)

( * ) Notice: Subject to any disclaimer, the term of this patent is extended or adjusted under 35 U.S.C. 154(b) by 141 days.

(21) Appl. No.: 12/003,159

(22) Filed: Dec. 20, 2007

(65) Prior Publication Data
US 2008/0150050 A1    Jun. 26, 2008

(30) Foreign Application Priority Data
Dec. 26, 2006   (TW) ................. 95148876 A (51) Int. Cl.
*H01L 23/02* (2006.01)
(52) U.S. Cl. .............. 257/680; 257/678; 382/124
(58) Field of Classification Search ................ 257/414, 257/415, 432, 680, 738; 382/124
See application file for complete search history.

(56) References Cited

U.S. PATENT DOCUMENTS

| | | | |
|---|---|---|---|
| 6,403,881 B1 * | 6/2002 | Hughes | 174/559 |
| 6,727,561 B2 * | 4/2004 | Sato et al. | 257/414 |
| 6,759,264 B2 | 7/2004 | Chou et al. | |
| 7,076,089 B2 | 7/2006 | Brandt et al. | |
| 7,099,497 B2 | 8/2006 | Chou et al. | |
| 2003/0215116 A1 | 11/2003 | Brandt et al. | |
| 2004/0046574 A1 | 3/2004 | Chou | |
| 2004/0188838 A1 * | 9/2004 | Okada et al. | 257/738 |
| 2004/0208345 A1 | 10/2004 | Chou et al. | |
| 2006/0091515 A1 * | 5/2006 | Weng et al. | 257/680 |
| 2007/0122013 A1 * | 5/2007 | Setlak et al. | 382/124 |

FOREIGN PATENT DOCUMENTS

| | | |
|---|---|---|
| TW | 526454 | 4/2003 |
| TW | 541503 B | 7/2003 |
| TW | 1243437 | 11/2005 |

* cited by examiner

*Primary Examiner* — Thanh V Pham
*Assistant Examiner* — Errol Fernandes
(74) *Attorney, Agent, or Firm* — Muncy, Geissler, Olds & Lowe, PLLC (57) ABSTRACT

An information sensing device includes a substrate, one information sensing chip, one electroconductive structure and a molded body. An electrical output portion including output connections is formed on the substrate. The information sensing chip is electrically connected to the electrical output portion and has one bottom chip surface mounted on the substrate, and one top chip surface to be close to or in contact with an object to sense specific information of the object. The electroconductive structure is electrically connected to the electrical output portion. The molded body is in contact with the information sensing chip and the at least one electroconductive structure to expose the top chip surface and a first surface of the electroconductive structure. The top chip surface is disposed opposite the bottom chip surface. The top chip surface and the first surface are exposed outside and disposed on substantially the same plane.

12 Claims, 6 Drawing Sheets

INFORMATION SENSING DEVICE WITH ELECTROCONDUCTIVE STRUCTURE AND MOLDED BODY SURROUNDING EACH OTHER

BACKGROUND OF THE INVENTION

1. Field of Invention

The invention relates to an information sensing device, which can be an image sensor, a fingerprint sensor, a vein sensor or other sensors, and a method of manufacturing the same, and more particularly to an information sensing device capable of preventing electrostatic discharge damage and a method of manufacturing the same. The information sensing chip of the invention can be found in the commonly assigned patent applications: (a) U.S. patent application Ser. No. 10/403,052, filed on Apr. 1, 2003, entitled "CAPACITIVE FINGERPRINT SENSOR", and issued on Aug. 29, 2006 as U.S. Pat. No. 7,099,497; (b) U.S. patent application Ser. No. 10/434,833, filed on May 13, 2003, entitled "PRESSURE TYPE FINGERPRINT SENSOR FABRICATION METHOD", and issued on Jul. 6, 2004 as U.S. Pat. No. 6,759,264; (c) U.S. patent application Ser. No. 10/414,214 (US20040208345A1), filed on Apr. 16, 2003, and entitled "THERMOELECTRIC SENSOR FOR FINGERPRINT THERMAL IMAGING"; (d) U.S. patent application Ser. No. 10/638,371 (US20040046574A1), filed on Aug. 12, 2003, and entitled "CAPACITIVE MICRO PRESSURE SENSING MEMBER AND FINGERPRINT SENSOR USING THE SAME"; and (e) Taiwan Patent Application No. 090112023, filed on May 17, 2001, and entitled "CAPACITIVE PRESSURE MICROSENSOR AND METHOD FOR MANUFACTURING THE SAME AND DETECTING SIGNALS OF THE SAME", now published as TW541503 and issued as Invention Patent Number 182652.

2. Related Art

A conventional semiconductor chip after being packaged has to be tested in the aspect of electrostatic discharge to ensure that the product design cannot be damaged due to the typical electrostatic discharge. The discharge modes include an air mode and a contact mode. The contact mode is a more severe mode for testing the electrostatic discharge. A probe has to contact with an electroconductive portion of a package body to perform the electrostatic discharge test.

Taking a fingerprint sensor as an example, the semiconductor information sensing chip has to provide an exposed chip surface to contact with the finger. The chip surface exposed to the environment tends to be interfered by some external effects, such as the grease and the remained contamination of the finger, and tends to be damaged by the electrostatic discharge to cause a serious problem.

In order to make the exposed chip surface of the package body (e.g., the fingerprint sensor) pass the electrostatic discharge test of the contact mode, the conventional method is to form an exposed metal layer on the chip surface to conduct the electrostatic charge, which approaches the chip surface, to the ground of the system. This aspect cannot pass the test standard in the electrostatic discharge of the severe contact mode. This is because an electroconductive metal layer of the chip surface is too close to a bottom integrated circuit, and the electromagnetic wave of the electrostatic discharge test may latch up the integrated circuit so that the chip cannot work normally or is damaged permanently.

In another aspect, a metal housing may be provided to cover the package body so that the electrostatic charge can be grounded through the metal housing. However, the assembling process is time-consuming and labor-consuming, and the manufacturing cost is increased. In addition, the metal housing may drop during the post processing steps, such as a SMT process.

Thus, it is an important subject of the invention to provide a semiconductor device, which has the reduced manufacturing cost and is advantageous to the automatic production, and a method of manufacturing the same.

SUMMARY OF THE INVENTION

It is therefore an object of the invention to provide an information sensing device, which has the reduced manufacturing cost and is advantageous to the automatic production of the information sensing device.

The invention achieves the above-identified object by providing an information sensing device including a substrate, an information sensing chip, at least one electroconductive structure and a molded body. An electrical output portion including output connections is formed on the substrate. The information sensing chip is electrically connected to the electrical output portion and has one bottom chip surface mounted on the substrate, and one top chip surface to be close to or in contact with an object to sense specific information of the object. The electroconductive structure is electrically connected to the electrical output portion. The molded body is in contact with the information sensing chip and the at least one electroconductive structure to expose the top chip surface and a first surface of the electroconductive structure. The top chip surface is disposed opposite the bottom chip surface. The top chip surface and the first surface are exposed outside and disposed on substantially the same plane.

The invention also provides a method of manufacturing an information sensing device. The method includes the steps of: forming a grounding pad assembly on a substrate; forming an electroconductive structure assembly electrically connected to the grounding pad assembly; mounting an information sensing chip on the substrate; pressing the information sensing chip and the electroconductive structure assembly by a mold to surround the information sensing chip and the electroconductive structure assembly to form a molding space; injecting a molding compound material to the molding space to partially surround the electroconductive structure assembly and the information sensing chip; hardening the molding compound material to form a molded body; and removing the mold from the molded body.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
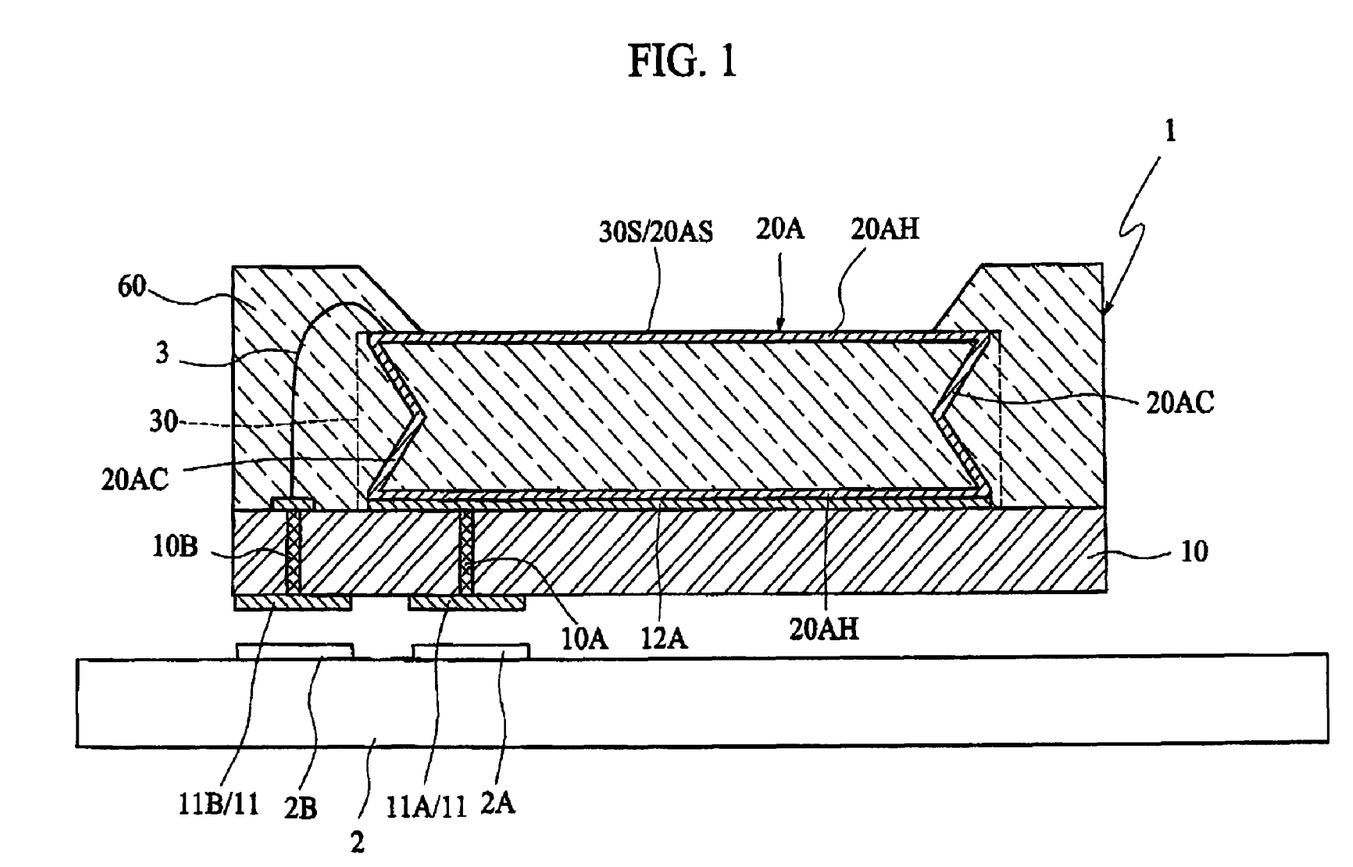
FIG. 1 is a cross-sectional view showing an information sensing device according to a first embodiment of the invention.

FIG. 1 is a cross-sectional view showing an information sensing device 1 according to a first embodiment of the invention. Referring to FIG. 1, the information sensing device 1 of the invention includes a substrate 10, an information sensing chip 30, a first electroconductive structure 20A and a molded body 60 to form a package body. The substrate 10 is formed with an electrical output portion 11 including a plurality of output connections 11A and 11B. The connection 11A is to be electrically connected to a connection 2A of a circuit board 2. The information sensing chip 30, having one bottom chip surface 30B and one top chip surface 30S disposed opposite the bottom chip surface 30B, is mounted on the substrate 10 and electrically connected to the output connection 11B of the electrical output portion 11 of the substrate 10 through a wire 3 and a metal via 10B. The bottom chip surface 30B is mounted on the substrate 10 (see FIG. 4). The output connection 11B may be directly electrically connected to a connection 2B of the circuit board 2. The first electroconductive structure 20A is electrically connected to the electrical output portion 11 of the substrate 10 through a first grounding pad 12A and a metal via 10A. The molded body 60 contacts with the information sensing chip 30 and the first electroconductive structure 20A to expose the top chip surface 30S of the information sensing chip 30 and a first surface 20AS of the first electroconductive structure 20A. Also, the electroconductive structure 20A further has a second surface 20AB (see FIG. 4) disposed opposite the first surface 20AS, and the second surface 20AB of the electroconductive structure 20A is mounted on the substrate 10. Thus, an electrostatic charge approaching the information sensing device can be conducted from the first electroconductive structure 20A to the electrical output portion 11 of the substrate 10. The top chip surface 30S is to be close to or in contact with an object, such as a finger, to sense an image (specific information) of the object, such as a fingerprint of the finger.

The information sensing chip, such as a semiconductor information sensing chip, is for sensing a full fingerprint image of the finger placed thereon or for sensing fragment fingerprint images of the finger sweeping thereacross. Thus, the information sensing chip must have an exposed chip surface to be close to or in contact with the finger to obtain the good sensing effect. Therefore, even if the information sensing chip is packaged, the chip surface still has to be exposed outside. The exposed chip surface tends to be damaged by the electrostatic charge, so an electrostatic discharge structure has to be formed on the information sensing device to protect the product from being damaged.

As shown in FIG. 1, the molded body 60 partially surrounds the information sensing chip 30 and the first electroconductive structure 20A, and the first electroconductive structure 20A is mounted on the substrate 10.

In another embodiment, the first electroconductive structure 20A may also partially surround the molded body 60, or partially surround the molded body 60 and the substrate 10. That is, the first electroconductive structure 20A covers the outer portions of the molded body 60 and the substrate 10.

Figure 6:
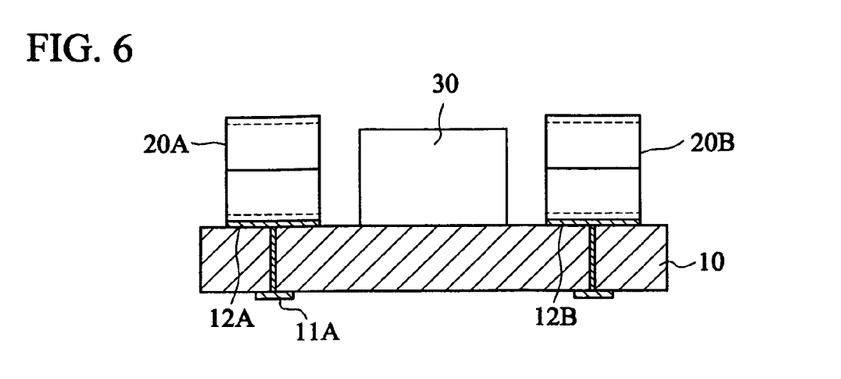
FIGS. 6 to 8 are partially cross-sectional and side views showing the steps of the method of manufacturing the information sensing device according to the first embodiment of the invention.
Figure 7:
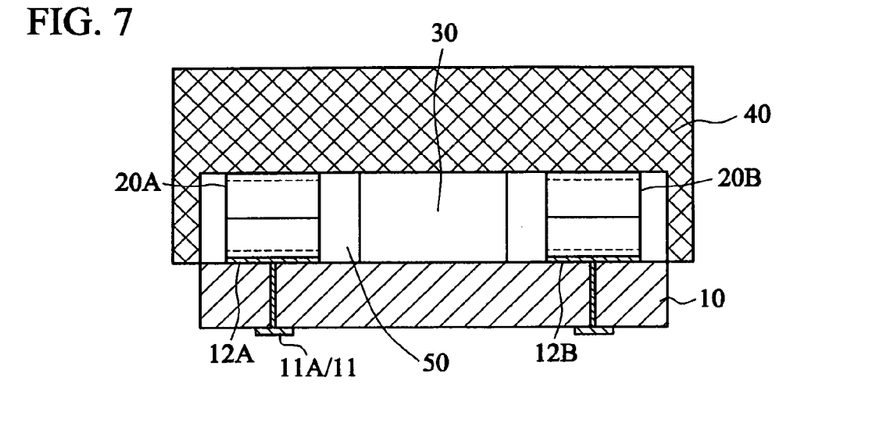
Figure 8:
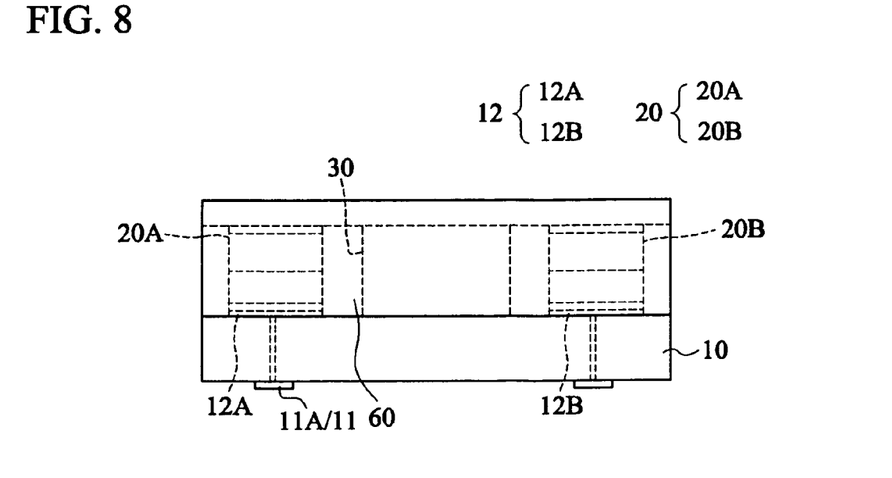

FIGS. 2 to 5 are pictorial views showing steps of a method of manufacturing the information sensing device according to the first embodiment of the invention. FIGS. 6 to 8 are partially cross-sectional and side views showing the steps of the method of manufacturing the information sensing device according to the first embodiment of the invention. The invention provides a method of manufacturing the information sensing chip 30. The method includes the following steps.

Figure 2:
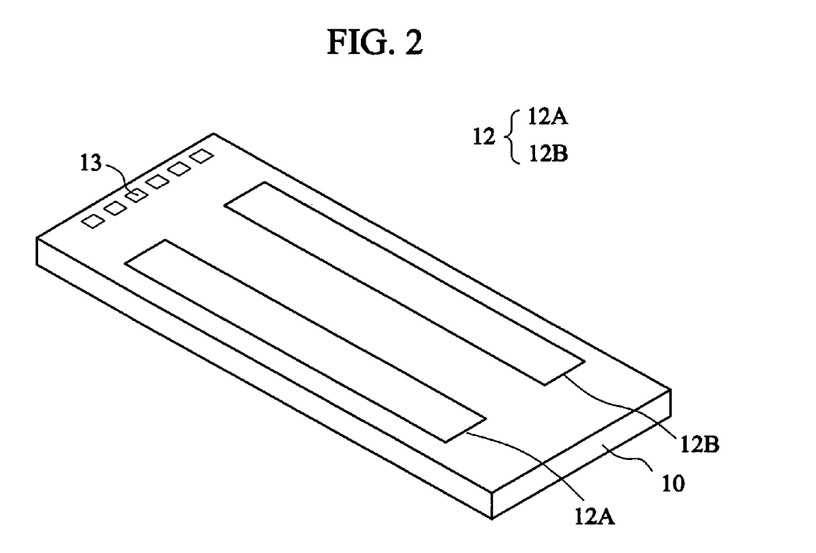
FIGS. 2 to 5 are pictorial views showing steps of a method of manufacturing the information sensing device according to the first embodiment of the invention.

First, as shown in FIG. 2, a grounding pad assembly 12 is formed on a substrate 10. In this embodiment, the grounding pad assembly 12 includes a first grounding pad 12A and a second grounding pad 12B. However, the grounding pad assembly 12 may also have only the first grounding pad 12A or the second grounding pad 12B.

Figure 3:
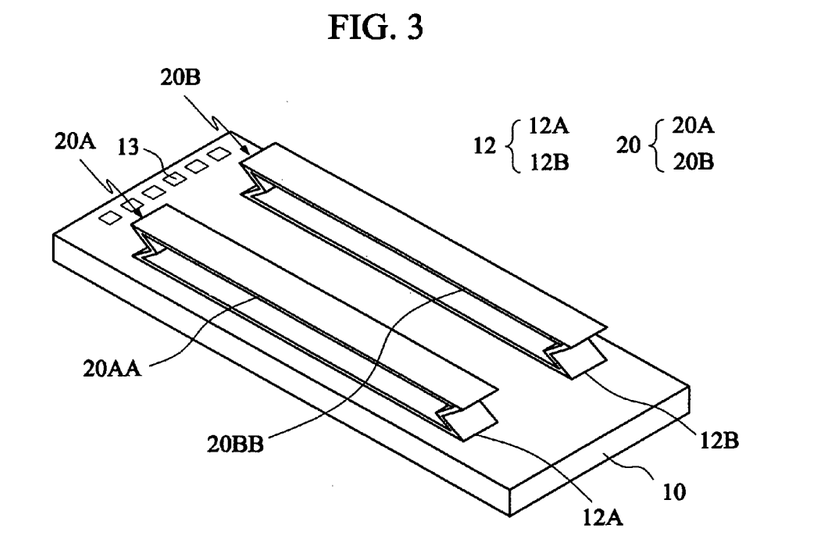

Next, as shown in FIG. 3, an electroconductive structure assembly 20 is formed on and electrically connected to the grounding pad assembly 12. In this embodiment, the electroconductive structure assembly 20 includes a first electroconductive structure 20A connected to the first grounding pad 12A and a second electroconductive structure 20B connected to the second grounding pad 12B. Alternatively, the electroconductive structure assembly 20 may also have only the first electroconductive structure 20A or the second electroconductive structure 20B in correspondence with the grounding pad assembly 12. In one embodiment, the first electroconductive structure 20A has a first three-dimensional structure formed by bending a first metal sheet 20AA.

Figure 4:
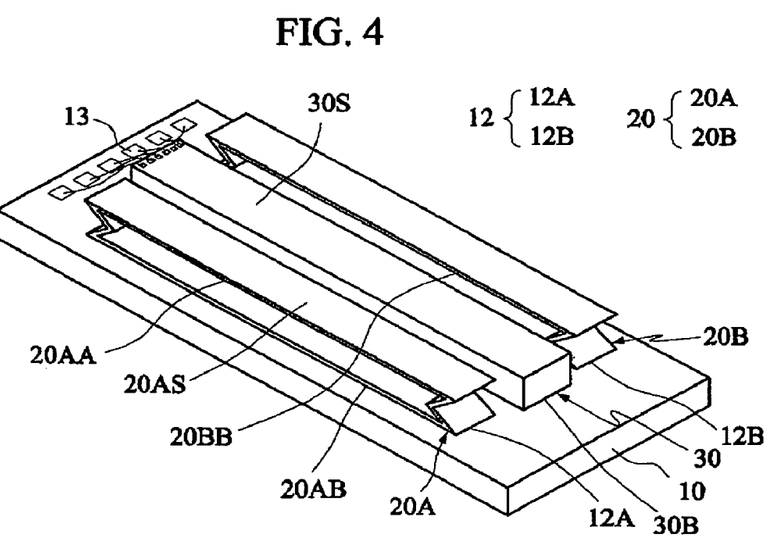

Then, as shown in FIGS. 4 and 6, one information sensing chip 30 is mounted on the substrate 10. Please note that the sensing chip and the conductors may be placed on the substrate in a reverse order or at the same time. In this embodiment, the information sensing chip 30 is a fingerprint sensing chip including, without limitation to, the optical, capacitive, pressure type or thermal-type sensing chip or other-types of sensing chips, and the information sensing chip 30 is disposed between the first electroconductive structure 20A and the second electroconductive structure 20B. In use, the finger sweeps forwards or backwards along the first electroconductive structure 20A, the information sensing chip 30 and the second electroconductive structure 20B. Next, the wire bonding operation of the information sensing chip 30 is finished to electrically connect the information sensing chip 30 to a plurality of chip bonding pads 13 on the substrate 10. The second electroconductive structure 20B is a second three-dimensional structure formed by bending a second metal sheet 20BB. It is to be noted that the usual standard SMT, chip mounting and wire-bonding technology may be adopted to mount and connect the electroconductive structure assembly 20 and the information sensing chip 30 on and to the substrate 10. Also, the three-dimensional structure is not limited to the closed structure shown in the drawing, but may also be an open structure as long as the elastic deformation can be achieved, or only an electroconductive structure having a fixed shape. In another embodiment, the conductive structure can be a semiconductor material with or without conductor coating. Next, as shown in FIG. 7, a mold 40 is provided to press the information sensing chip 30 and the electroconductive structure assembly 20 and to surround the information sensing chip 30 and the electroconductive structure assembly 20 to form a molding space 50. The first electroconductive structure 20A is higher than the information sensing chip 30 and has elasticity, and the second electroconductive structure 20B is higher than the information sensing chip 30 and has elasticity. According to this property, when the mold 40 is provided to press the information sensing chip 30 and the electroconductive structure assembly 20, the mold 40 first presses the electroconductive structure assembly 20 to deform the electroconductive structure assembly 20 and then presses the information sensing chip 30.

In another embodiment, the height of the electroconductive structure may be precisely designed to be equal to that of the chip. In another embodiment, the height of the electroconductive structure may be higher than the chip surface. Of course, the chip surface may also be higher than the electroconductive structure.

Then, a molding compound material is injected into the molding space 50 to partially surround the electroconductive structure assembly 20 and the information sensing chip 30, and the compound material is hardened to form a molded body 60.

Figure 5:
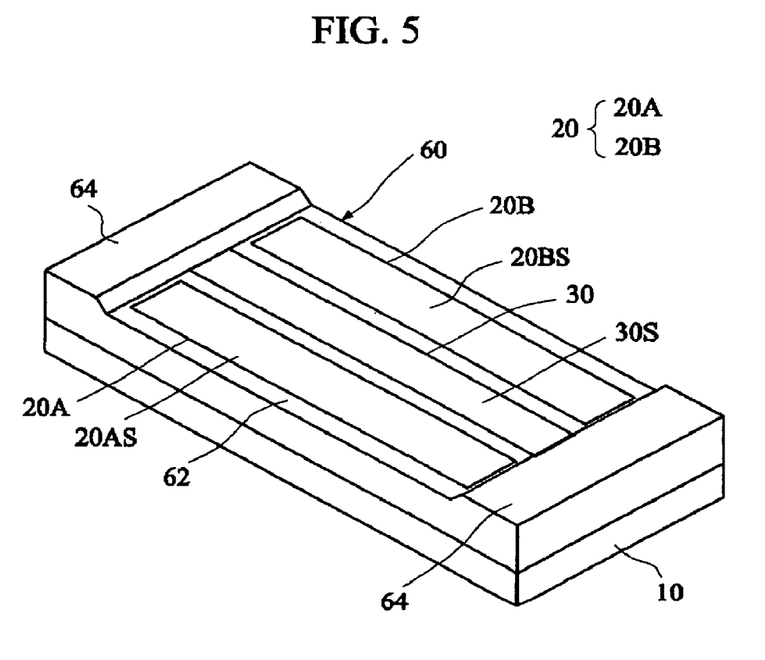

Finally, the mold 40 is removed from the molded body 60 to form the information sensing device, as shown in FIGS. 5 and 8. In this manner, the top chip surface 30S and the first surface 20AS are exposed outside and disposed on substantially the same plane. The information sensing device includes the substrate 10, the information sensing chip 30, the first electroconductive structure 20A, the second electroconductive structure 20B and the molded body 60. The information sensing chip 30 is mounted on and electrically connected to the substrate 10. The first electroconductive structure 20A is mounted on and electrically connected to the substrate 10, and is disposed at one side of the information sensing chip 30. The second electroconductive structure 20B is mounted on and electrically connected to the substrate 10, and is disposed at another side of the information sensing chip 30. The second electroconductive structure 20B can be omitted.

The molded body 60 partially surrounds the information sensing chip 30 and the first electroconductive structure 20A to expose the chip surface 30S of the information sensing chip 30 and the first surface 20AS of the first electroconductive structure 20A so that an electrostatic charge approaching the information sensing device is conducted from the first electroconductive structure 20A to the substrate 10. In this embodiment, the information sensing chip 30 is disposed outside a portion of the molded body. 60, which is surrounded by the electroconductive structure 20A/20B. The electroconductive structure 20A includes two horizontal plates 20AH disposed opposite each other and located at different levels with respect to the substrate 10, and two angled connecting plates 20AC for connecting the two horizontal plates 20AH together. In addition, the molded body 60 also partially surrounds the second electroconductive structure 20B to expose a second surface 20BS of the second electroconductive structure 20B so that another electrostatic charge approaching the information sensing device is conducted from the second electroconductive structure 20B to the substrate 10. In another embodiment, besides the ESD function, the electroconductive structure assembly 20 can perform signal driving or sensing functions. For example, as a RF-type fingerprint sensor, the RF signal can be driven via, the electroconductive structures into finger skin and then a reflected RF signal from the finger skin can be sensed by the sensor cells on the information sensing chip 30. On the contrary, the electroconductive structures can also be used as the finger-contacting sensor for detecting if the finger is on the sensing chip or not.

Two side portions 64 of the molded body 60 are higher than a middle portion 62 of the molded body 60, the chip surface 30S, the first surface 20AS and the second surface 20BS. In use, the finger is restricted by the two side portions 64 and sweeps across the first electroconductive structure 20A, the information sensing chip 30 and the second electroconductive structure 20B forwards or backwards.

The chip surface 30S of the information sensing chip 30 has an electroconductive portion, such as an electrostatic discharge metal mesh. Alternatively, the chip surface 30S of the information sensing chip 30 may also have no electroconductive portion but pertain to an insulating surface.

FIGS. 9 to 12 are partially cross-sectional and side views showing steps of a method of manufacturing an information sensing device according to a second embodiment of the invention. As shown in FIGS. 9 to 12, the invention provides another method of manufacturing the information sensing chip 30. The method includes the following steps.

Figure 9:
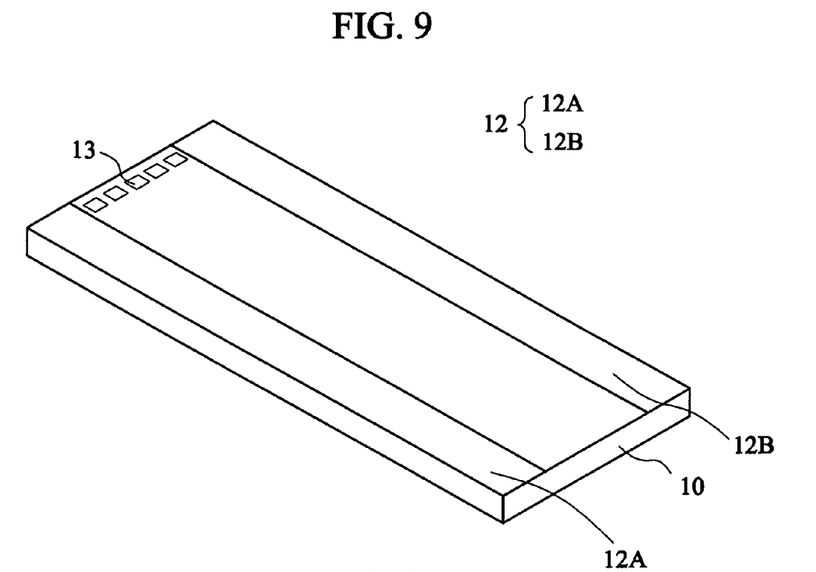
FIGS. 9 to 12 are partially cross-sectional and side views showing steps of a method of manufacturing an information sensing device according to a second embodiment of the invention.

First, as shown in FIG. 9, a grounding pad assembly 12 is formed on a substrate 10. In this embodiment, the grounding pad assembly 12 includes a first grounding pad 12A and a second grounding pad 12B. However, the grounding pad assembly 12 may also have only the first grounding pad 12A or the second grounding pad 12B.

Figure 10:
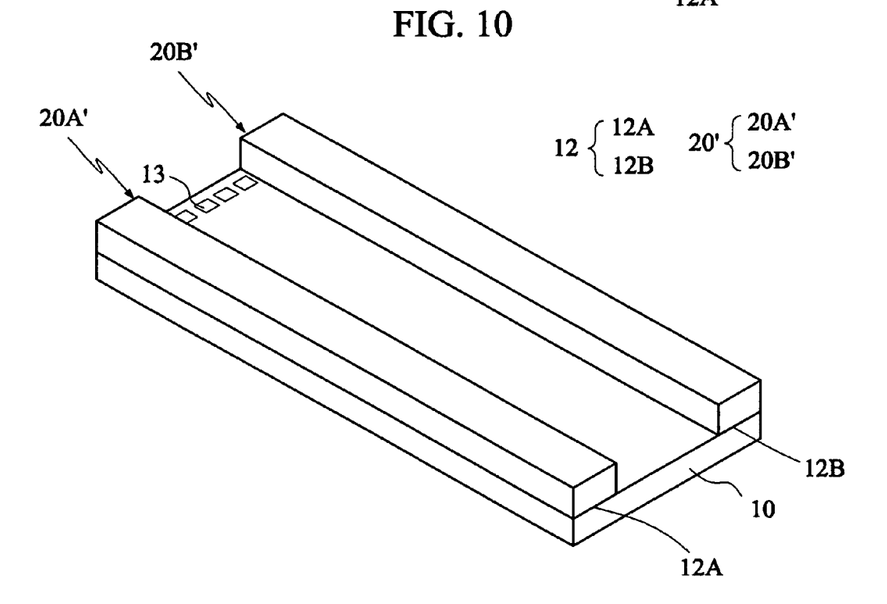

Next, as shown in FIG. 10, an electroconductive structure assembly 20' is formed on and electrically connected to the grounding pad assembly 12. In this embodiment, the electroconductive structure assembly 20' is for replacing the metal structure directly formed on the grounding pad assembly 12 and is made of an electroconductive polymer by way of transfer molding, for example. Thus, the electroconductive structure assembly 20' includes a first electroconductive structure 20A' mounted on the first grounding pad 12A and a second electroconductive structure 20B' mounted on the second grounding pad 12B. Alternatively, the electroconductive structure assembly 20' may also have only the first electroconductive structure 20A' or the second electroconductive structure 20B' in correspondence with the grounding pad assembly 12.

Figure 11:
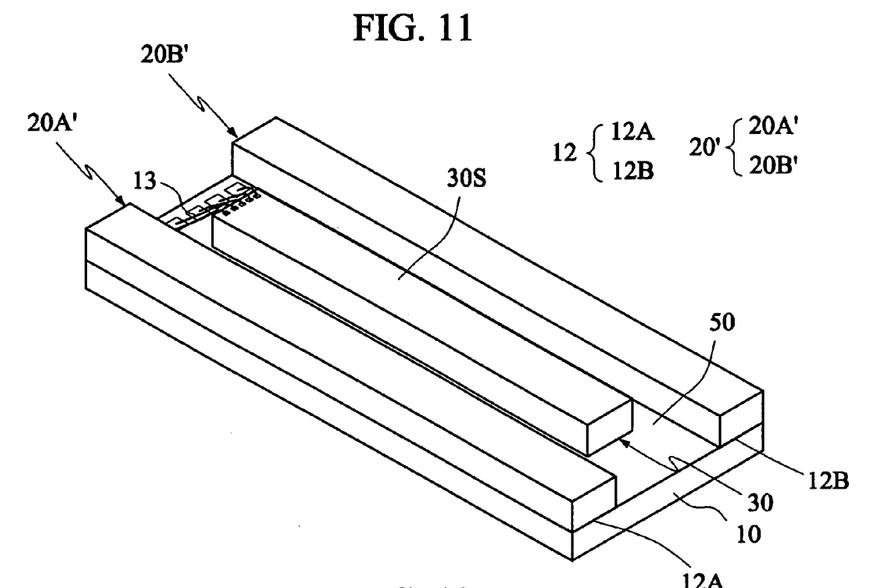

Thereafter, as shown in FIG. 11, one information sensing chip 30 is mounted on the substrate 10. In this embodiment, the information sensing chip 30 includes, without limitation to, the capacitive, pressure type or thermal-type information sensing chip, and the information sensing chip 30 is disposed between the first electroconductive structure 20A' and the second electroconductive structure 20B'. Next, the wire bonding operation of the information sensing chip 30 is finished to electrically connect the information sensing chip 30 to a plurality of chip bonding pads 13 on the substrate 10.

In addition, the electroconductive structures 20A' and 20B' are respectively disposed on two lateral sides of the substrate 10. Next, similar to FIG. 7, a mold 40 is provided to press the information sensing chip 30 and the electroconductive structure assembly 20' and to surround the information sensing chip 30 and the electroconductive structure assembly 20' to form a molding space 50.

Then, a molding compound material is injected into the molding space 50 to partially surround the electroconductive structure assembly 20' and the information sensing chip 30, and the molding compound material is hardened to form a molded body 60.

Figure 12:
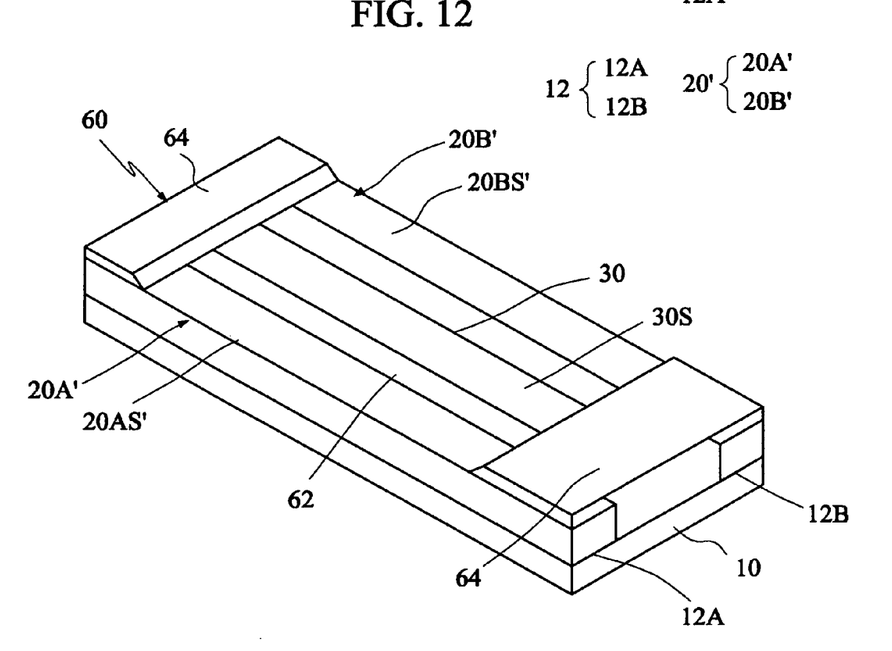

Finally, the mold 40 is removed from the molded body 60 to form the information sensing device, as shown in FIG. 12. The information sensing device includes the substrate 10, the information sensing chip 30, the first electroconductive structure 20A', the second electroconductive structure 20B' and the molded body 60. The information sensing chip 30 is mounted on and electrically connected to the substrate 10. The first electroconductive structure 20A' is mounted on and electrically connected to the substrate 10, and is disposed on one side of the information sensing chip 30. The second electroconductive structure 20B' is mounted on and electrically connected to the substrate 10, and is disposed on the other side of the information sensing chip 30. The second electroconductive structure 20B' may be omitted.

The molded body 60 partially surrounds the information sensing chip 30 and the first electroconductive structure 20A' to expose a chip surface 30S of the information sensing chip 30 and a first surface 20AS' of the first electroconductive structure 20A' so that an electrostatic charge approaching the information sensing device is conducted from the first electroconductive structure 20A' to the substrate 10. In addition, the molded body 60 also partially surrounds the second electroconductive structure 20B' to expose a second surface 20BS' of the second electroconductive structure 20B' so that another electrostatic charge approaching the information sensing device is conducted from the second electroconductive structure 20B' to the substrate 10.

Two side portions 64 of the molded body 60 are higher than a middle portion 62 of the molded body 60, the chip surface 30S, the first surface 20AS' and the second surface 20BS'. The chip surface 30S of the information sensing chip 30 has an electroconductive portion, such as an electrostatic discharge metal mesh. Alternatively, the chip surface 30S of the information sensing chip 30 may also have no electroconductive portion but pertain to an insulating surface.

According to the manufacturing method of the invention, the current semiconductor package technology can be adopted to automatically manufacture the information sensing chip so that the manpower cost can be reduced and the competition ability of the product can be enhanced.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. An information sensing device, comprising:
    a substrate, on which an electrical output portion comprising a plurality of output connections is formed, the electrical output portion being to be electrically connected to a circuit board;
    one information sensing chip electrically connected to the electrical output portion of the substrate, wherein the information sensing chip has one bottom chip surface mounted on the substrate, and one top chip surface to be close to or in contact with an object to sense specific information of the object;
    at least one electroconductive structure electrically connected to the electrical output portion of the substrate, wherein the at least one electroconductive structure comprises:
        two horizontal plates disposed opposite each other and located at different levels with respect to the substrate; and
        two connecting plates for connecting the two horizontal plates together; and
    a molded body, which is in contact with the information sensing chip and the at least one electroconductive structure to expose the top chip surface of the information sensing chip and a first surface of the at least one electroconductive structure, wherein the top chip surface is disposed opposite the bottom chip surface, and the top chip surface and the first surface are exposed outside.

2. The device according to claim 1, wherein an electrostatic charge approaching the information sensing device is conducted from the at least one electroconductive structure to the electrical output portion of the substrate.

3. The device according to claim 1, wherein the molded body partially surrounds the information sensing chip and the at least one electroconductive structure, and the at least one electroconductive structure is mounted on the substrate.

4. The device according to claim 3, wherein two side portions of the molded body are higher than a middle portion of the molded body, the top chip surface and the first surface.

5. The device according to claim 1, wherein the at least one electroconductive structure partially surrounds the molded body and the substrate.

6. The device according to claim 1, wherein the electroconductive structure can perform signal driving or sensing functions.

7. The device according to claim 1, wherein the information sensing chip is a fingerprint sensing chip and the top chip surface of the fingerprint sensing chip is to be close to or in contact with a finger to sense a fingerprint of the finger.

8. The device according to claim 1, wherein each of the connecting plates is angled.

9. The device according to claim 1, wherein the at least one electroconductive structure and the information sensing chip have substantially the same height.

10. The device according to claim 1, wherein the information sensing chip is disposed outside a portion of the molded body, which is surrounded by the electroconductive structure.

11. The device according to claim 1, wherein the top chip surface and the first surface are disposed on substantially the same plane.

12. The device according to claim 1, wherein the electroconductive structure further has a second surface disposed opposite the first surface, and the second surface of the electroconductive structure is mounted on the substrate.

* * * * *